(12) United States Patent
Lin et al.

(10) Patent No.: US 9,583,474 B2
(45) Date of Patent: Feb. 28, 2017

(54) PACKAGE ON PACKAGING STRUCTURE AND METHODS OF MAKING SAME

(71) Applicant: Taiwan Semiconductor Manufacturing Company, Ltd., Hsin-Chu (TW)

(72) Inventors: Wen-Yi Lin, New Taipei (TW); Jiun Yi Wu, Zhongli (TW); Jing Ruei Lu, Taipei (TW); Po-Yao Lin, Zhudong Township (TW); Ming-Chih Yew, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 86 days.

(21) Appl. No.: 14/592,587

(22) Filed: Jan. 8, 2015

(65) Prior Publication Data

US 2015/0200190 A1    Jul. 16, 2015

Related U.S. Application Data

(62) Division of application No. 13/250,606, filed on Sep. 30, 2011, now Pat. No. 8,946,888.

(51) Int. Cl.
*H01L 21/00* (2006.01)
*H01L 25/00* (2006.01)
(Continued)

(52) U.S. Cl.
CPC .............. *H01L 25/50* (2013.01); *H01L 23/36* (2013.01); *H01L 23/3675* (2013.01);
(Continued)

(58) Field of Classification Search
CPC ..... H01L 2224/17519; H01L 23/49827; H01L 23/3677; H01L 2224/32145; H01L 2225/1058
(Continued)

(56) References Cited

U.S. PATENT DOCUMENTS 7,646,093 B2   1/2010   Braunisch et al.
8,921,990 B2 * 12/2014  Park ................. H01L 23/367
                                                257/680
(Continued)

FOREIGN PATENT DOCUMENTS

TW         I244704       12/2005

OTHER PUBLICATIONS

Bowers, M., et al. "Thermal Characterization of Package-On-Package (POP)," 25th IEEE Semi-Therm Symposium, 2009, pp. 309-316.
(Continued)

*Primary Examiner* — S. V. Clark
(74) *Attorney, Agent, or Firm* — Slater Matsil, LLP

(57) ABSTRACT

A package on packaging structure provides for improved thermal conduction and mechanical strength by the introduction of a sold thermal coupler between the first and second packages. The first package has a first substrate and through vias through the first substrate. A first set of conductive elements is aligned with and coupled to the through vias of the first substrate. A solid thermal coupler is coupled to the first set of conductive elements and to a die of the second package. A second set of conductive elements is coupled to the die and a bottom substrate is coupled to the second set of conductive elements. The thermal coupler may be, e.g., an interposer, a heat spreader, or a thermal conductive layer.

20 Claims, 6 Drawing Sheets

(51) Int. Cl.
  *H01L 23/36* (2006.01)
  *H01L 23/367* (2006.01)
  *H01L 23/42* (2006.01)
  *H01L 23/498* (2006.01)
  *H01L 25/10* (2006.01)
  *H01L 23/00* (2006.01)

(52) U.S. Cl.
  CPC .......... *H01L 23/3677* (2013.01); *H01L 23/42* (2013.01); *H01L 23/49816* (2013.01); *H01L 23/49827* (2013.01); *H01L 23/49838* (2013.01); *H01L 24/81* (2013.01); *H01L 25/105* (2013.01); *H01L 24/16* (2013.01); *H01L 24/32* (2013.01); *H01L 24/48* (2013.01); *H01L 24/73* (2013.01); *H01L 2224/16146* (2013.01); *H01L 2224/16225* (2013.01); *H01L 2224/16235* (2013.01); *H01L 2224/17519* (2013.01); *H01L 2224/291* (2013.01); *H01L 2224/293* (2013.01); *H01L 2224/2929* (2013.01); *H01L 2224/32145* (2013.01); *H01L 2224/32225* (2013.01); *H01L 2224/48227* (2013.01); *H01L 2224/48465* (2013.01); *H01L 2224/73253* (2013.01); *H01L 2224/73265* (2013.01); *H01L 2224/81801* (2013.01); *H01L 2225/1023* (2013.01); *H01L 2225/1058* (2013.01); *H01L 2225/1094* (2013.01); *H01L 2924/15311* (2013.01); *H01L 2924/15331* (2013.01); *H01L 2924/181* (2013.01)

(58) Field of Classification Search
  USPC .................. 438/107, 108, 109, 110, 122, 125
  See application file for complete search history.

(56) References Cited

U.S. PATENT DOCUMENTS

| | | | |
|---|---|---|---|
| 9,129,929 B2* | 9/2015 | Lundberg | H01L 23/34 |
| 2002/0074668 A1 | 6/2002 | Hofstee et al. | |
| 2002/0151189 A1 | 10/2002 | Pendse et al. | |
| 2005/0184377 A1* | 8/2005 | Takeuchi | H01L 21/6835 |
| | | | 257/686 |
| 2008/0116589 A1 | 5/2008 | Li et al. | |
| 2009/0294947 A1 | 12/2009 | Tain et al. | |
| 2011/0210444 A1 | 9/2011 | Jeng et al. | |
| 2012/0241954 A1 | 9/2012 | Warren et al. | |
| 2013/0082372 A1 | 4/2013 | Lin et al. | |
| 2015/0130078 A1* | 5/2015 | Hong | H01L 23/34 |
| | | | 257/774 |
| 2015/0340349 A1* | 11/2015 | Yu | H01L 23/3157 |
| | | | 257/777 |

OTHER PUBLICATIONS

Hoe, Y.Y.G., et al., "Effect of TSV Interposer on the Thermal Performance of FCBGA Package," 11th Electronics Packaging Technology Conference, 2009, pp. 778-786.

Lin, W., et al., "PoP/CSP Warpage Evaluation and Viscoelastic Modeling," IEEE, Electronic Components and Technology Conference, 2008, pp. 1576-1581.

* cited by examiner

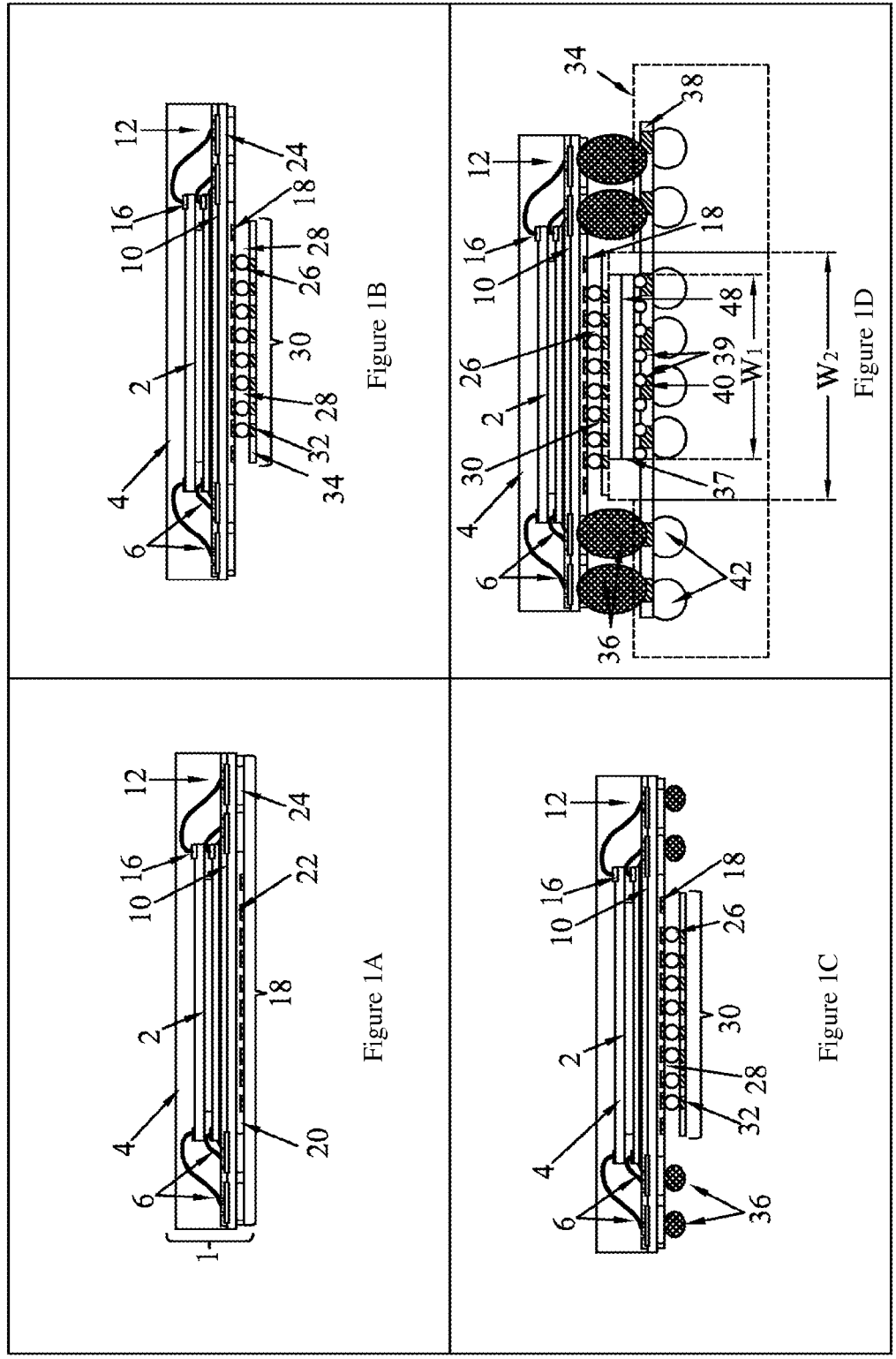

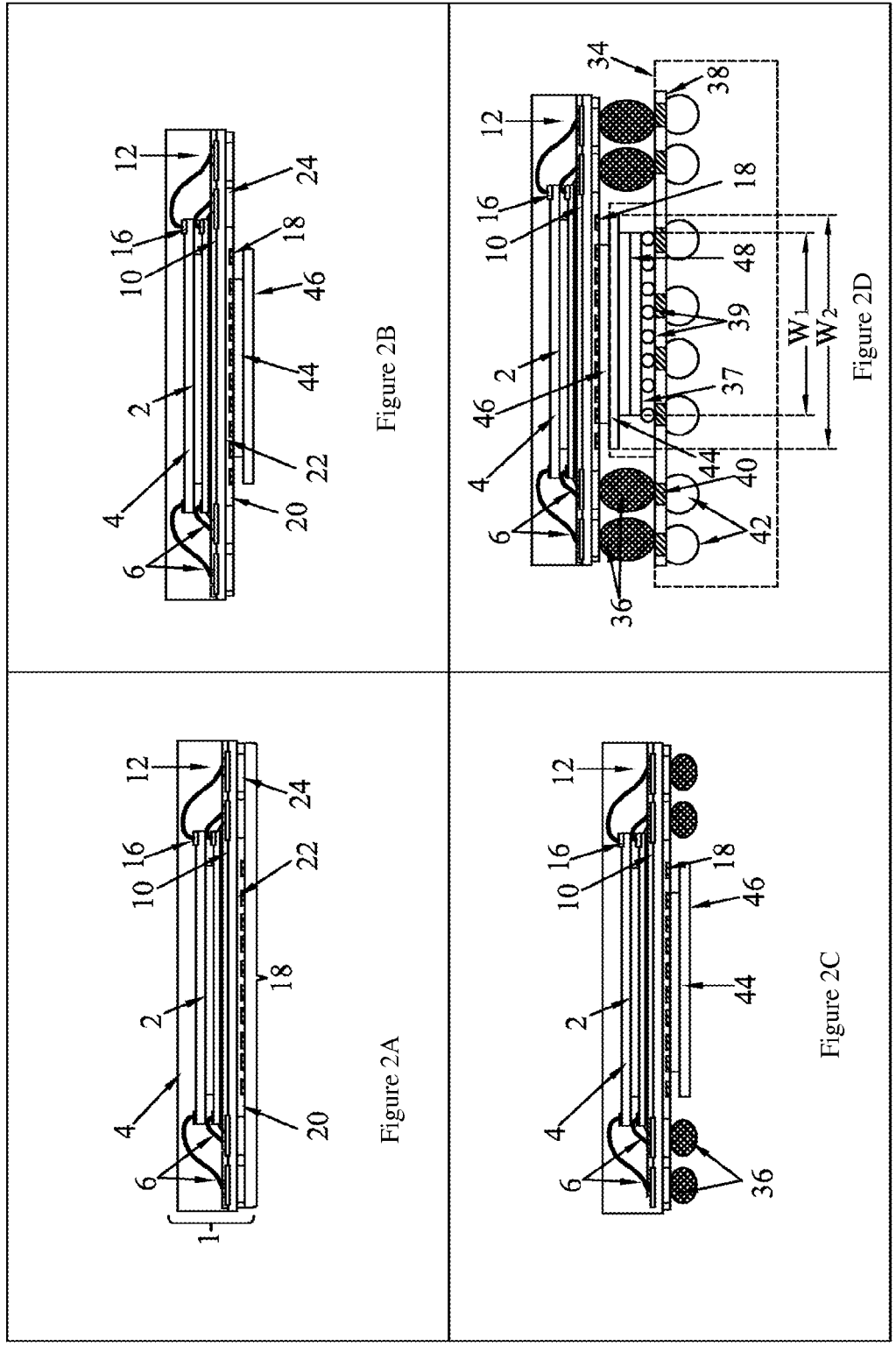

PACKAGE ON PACKAGING STRUCTURE AND METHODS OF MAKING SAME

This application is a divisional of patent application Ser. No. 13/250,606, entitled "Package on Packaging Structure and Methods of Making Same," filed on Sep. 30, 2011, which application is incorporated herein by reference.

BACKGROUND

Package on Package (PoP) is becoming an increasingly popular integrated circuit packaging technique because it allows for higher density electronics. But increasing die power of a bottom package in a POP not only results in thermal dissipation inefficiency, but leads to severe thermal stress and warpage caused by thermal expansion mismatch between the components of the package.

BRIEF DESCRIPTION OF THE DRAWINGS

For a more complete understanding of the present invention, and the advantages thereof, reference is now made to the following descriptions taken in conjunction with the accompanying drawings, in which:

FIGS. 1A through 1E are cross sectional views of steps in the manufacture of a first embodiment device;

FIGS. 2A through 2E are cross sectional views of steps in the manufacture of a second embodiment device.

DETAILED DESCRIPTION OF ILLUSTRATIVE EMBODIMENTS

Various steps in the formation of Package on Package (PoP) will be described with reference to FIGS. 1A through 3D. It should be appreciated that the materials, geometries, dimensions, structures, and process parameters described herein are exemplary only, and are not intended to be, and should not be construed to be, limiting to the invention claimed herein. Many alternatives and modifications will be apparent to those skilled in the art, once informed by the present disclosure.

Figure 1E:
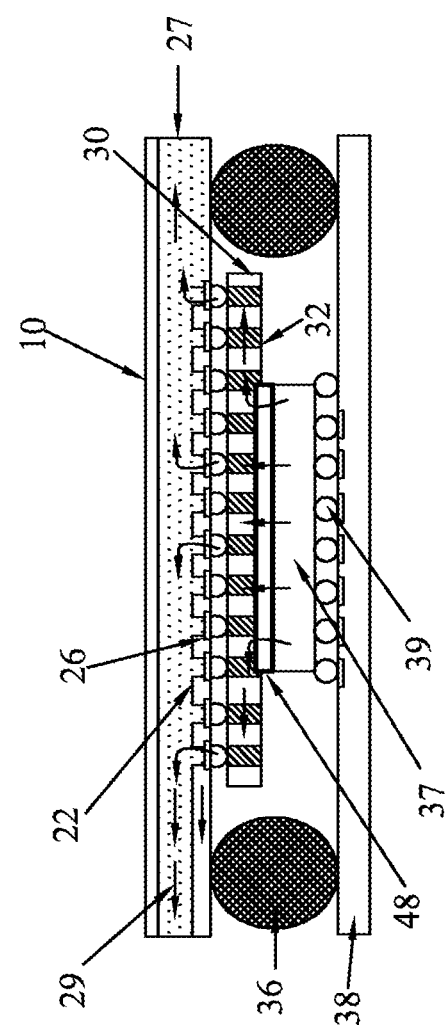

A first embodiment package will be discussed with reference to FIGS. 1A through 1E). FIG. 1A illustrates a top package 1 to be employed in the PoP package. Top package 1, which may be formed using a plastic ball grid array (PBGA) package assembly process or the like, includes a plurality of stacked die 2, which may be wire bonded to top substrate 10 by way of contacts 16 (on respective stacked die 2), bond wires 6, and contacts 12 (on top substrate 10). Individual stacked die may comprise a memory chip, a logic chip, a processor chip, or the like. Although FIG. 1A illustrates three stacked die this is for illustration only. Likewise, the use of wire bonding is merely illustrative and other approaches for electrically connecting the stacked die are within the contemplated scope of the present disclosure.

Top substrate 10 may be a laminated circuit board comprised of alternating layers of non-conductive polymers, such as bismaleinide-triazine (BT), and patterned (or non-patterned) conductive layers. As discussed above, top substrate 10 has contacts 12 on a first side (referred to herein sometimes as a top side for convenience) for electrical connection to stacked die 2. Top substrate 10 further has contacts 24 on a second side (sometimes referred to as a bottom side) for electrical connection to other components as will be detailed further below.

FIG. 1A further illustrates ground pad 18 on the bottom side of top substrate 10. As will be explained in greater detail with regard to FIG. 1E, ground pad 18 provides a path for thermal conduction of heat from a bottom package that will be subsequently attached to top package 1. Electrical and/or thermal contact to ground pad 18 may be made by way of thermal vias 22, which may be formed of copper, solder, aluminum, or other conductive materials.

FIG. 1B illustrates the attachment of interposer 30 to top package 1. Interposer 30 may be composed of a semiconductor material such as silicon, germanium or gallium arsenate. Interposer 30 may have a thickness of about 100 microns to about 300 microns. Through vias 32, which may be composed of copper, or may be composed of tungsten, aluminum, solder, or the like, pass through interposer 30. Through vias 32 may aligned with solder bumps 26, which electrically and thermally connect interposer 30 to top package 1. Alternately, through vias 32 may be not aligned with solder bumps 26. More particularly, through vias 32 are electrically and/or thermally connected to ground pad 18 by way of solder bumps 26 and thermal vias 22. Underfill 28 might surround solder bumps 26. Although solder bumps are illustrated, connection between interposer 30 and top package 1 could be made by way of solder balls, copper bumps, copper pillars, or other connector elements. Hence, the term connector element may be used herein to refer to solder bumps or any other form of connector elements 26.

Through vias 32 might have a pitch of about 0.1 mm to about 0.3 mm. Through vias 32 have an aspect ratio defined as the ratio of the thickness of interposer 30 to the width of through vias 32, where the aspect ratio is about 2 to about 6. It is believed that this aspect ratio provides the most advantageous range for improving thermal conductivity of the resulting package. Through vias 32 also may have a pitch (i.e., center to center spacing) in the range of about 0.1 mm to about 0.3 mm for advantageous thermal conduction. Through vias 32 may be composed of a copper or aluminum surface, which may be filled with a highly thermally conductive material, such as copper, tungsten, aluminum, or a polymer. In addition to providing for improved thermal conduction, interposer 30 also provides mechanical stiffening to the resulting package. In this way, interposer 30 provides stiffness and resistance to warping that might otherwise occur as a result of thermal coefficient of expansion (CTE) mismatch between top package 1 and bottom package 34 (illustrated in FIG. 1D).

Continuing with FIG. 1C, solder balls 36 are attached to bottom contacts 24 of top substrate 10. Solder balls 36 allow for electrical and/or thermal connection between top package 1 and bottom package 34 (not shown, but illustrated in FIG. 1D). In the illustrated embodiment, solder balls 36 provide for electrical conduction of signals and power to stacked die 2. Again, other connection components, such as conductive bumps, conductive balls, conductive pillars, and the like, could be employed in lieu of solder balls 36.

Bottom package 34 is attached to top package 1, as illustrated in FIG. 1D. Bottom package 34 includes die 37, which is flip chip attached to bottom substrate 38, and which is electrically connected thereto by way of connector elements 39. Electrical connection between die 37 and an underlying mother board or other circuitry (not shown) is provided by through vias 40 aligned with connector elements 39 on one side of bottom substrate 38 and connector elements 42 on the other side of bottom substrate 38. Likewise, electrical connection between top substrate 10 and an underlying mother board or other circuitry is provided by connector elements 36, through vias 40, and connector elements 42.

An advantageous feature of the illustrated package of FIG. 1D is a thermal conduction path provided between die 37 (in bottom package 34) and a thermally conductive layer 27, such as a ground plane (illustrated in FIG. 1E) in top substrate 10. This thermal conduction path is provided as follows. Die 37, which is flip chip connected to bottom substrate 38 has its so-called back side attached to interposer 30. As was described above, interposer 30 includes a plurality of through vias 32 that provide for good thermal conduction. A layer of thermal interface material 48 may be applied to die 37. Thermal interface material 48 may comprise a solder paste, a high conductivity adhesive or thermal grease. In this manner, heat may be conducted away from die 37 and toward top substrate 10, to which interposer 30 is attached.

FIG. 1E provides a more detailed view of interposer 30 and top substrate 10. Top substrate 10 may be a laminated substrate having multiple layers of dielectric layers and conductive layer. Layer 27, which may be a ground plane, a power plane, or the like, is an illustrative example of a conductive layer. In the illustrated embodiment, heat may be conducted away from die 37 by the heat conduction paths illustrated by arrows 29. For instance, heat may be conducted from die 37 to interposer 30 through thermal interface material 48. As addressed above, through vias 32 provide for good thermal conduction through interposer 30. Heat is conducted away from interposer 30 through connector elements 26 (solder bumps, solder balls, copper bumps, copper pillars, or the like) to thermal vias 22 and thence to conductive layer 27. Conductive layer 27 may be a large continuous layer of conductive material that operates as a heat sink and or a heat conduction path.

Returning for a moment to FIG. 1D, another advantageous feature of the illustrated embodiment is shown. As illustrated, die 37 has a width, indicated as $W_1$. As such, it is sufficient for making thermal contact to die 37 that interposer 30 has a width roughly equivalent to $W_1$. Note, however, that in the illustrated embodiment, interposer 30 has a width $W_2$ which is larger than $W_1$. In some embodiments $W_2$ is from about 1.2 to about 1.5 times $W_1$. In this way, interposer 30 provides an additional role of providing mechanical stiffness to the resulting package in addition to conducting heat away from die 37. It is believed that this mechanical stiffness prevents, or at least reduces the severity of warpage resulting from, e.g., thermal expansion mismatch between the components of the resulting package.

A second embodiment package will be discussed with reference to FIGS. 2A through 2E. Where appropriate, like or analogous elements are referenced with a common reference numeral in FIGS. 1A through 1E and 2A through 2E. Beginning with FIG. 2A, top package 1, to be employed in the PoP package, is illustrated. Top package 1 in FIG. 2A may be formed by the same processes as top package 1 in FIG. 1A, and top package 1 in FIG. 2A may include the same elements as package 1 in the first embodiment.

FIG. 2B illustrates the attachment of heatspreader 46 to top package 1. Heatspreader 46 may be composed of a conductive material such as aluminum, copper tungsten, copper, or tin, although it may be composed of silicon carbide or graphite. Heatspreader 46 may have a thickness of about 500 microns. Heatspreader 46 is electrically and/or thermally connected to ground pad 18 of top package 1 by way of conductive layer 44, which may be solder, or may be another thermally conductive material, such as highly conductive adhesive or thermal grease.

In addition to providing for improved thermal conduction, heatspreader 46 also provides mechanical stiffening to the resulting package. In this way, heatspreader 46 provides stiffness and resistance to warping that might otherwise occur as a result of thermal coefficient of expansion (CTE) mismatch between top package 1 and bottom package 34 (illustrated in FIG. 2D).

Continuing with FIG. 2C, connector elements 36 are attached to bottom contacts 24 of top substrate 10. As in the first embodiment, connector elements 36 allow for electrical and/or thermal connection between top package 1 and bottom package 34 (not shown, but illustrated in FIG. 2D).

Bottom package 34 is attached to top package 1, as illustrated in FIG. 2D. As in the first embodiment, bottom package 34 includes die 37 which may be attached to an underlying mother board or other circuitry (not shown). Bottom substrate 38 contains through vias 40 which are aligned with connector elements 39 on one side of bottom substrate 38 and connector elements 42 on the other side of bottom substrate 38. Electrical connection between top substrate 10 and an underlying mother board or other circuitry is provided by connector elements 36, through vias 40, and connector elements 42.

Figure 2E:
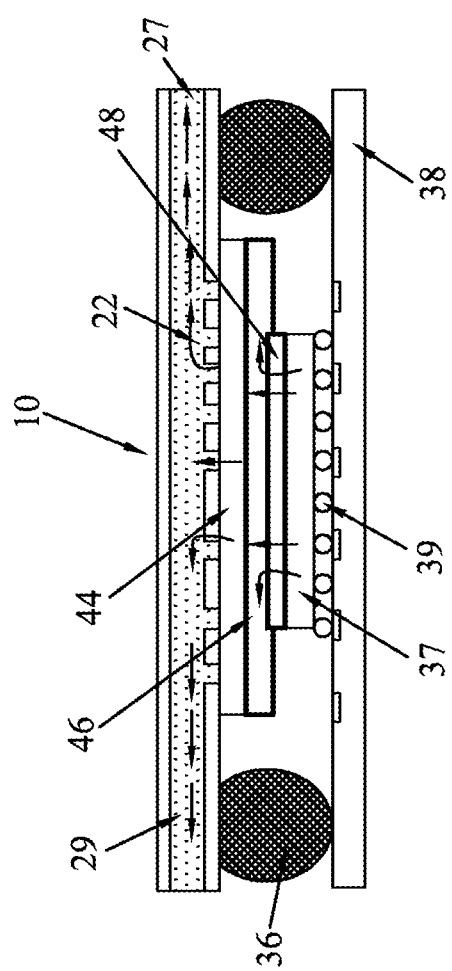

As in the first embodiment, an advantageous feature of the illustrated package of FIG. 2D is a thermal conduction path provided between die 37 (in bottom package 34) and a thermally conductive layer 27, such as a ground plane (illustrated in FIG. 2E) in top substrate 10. This thermal conduction path is provided as follows. Die 37, which is flip chip connected to bottom substrate 38 has its so-called back side attached to heatspreader 46. As was described above, heatspreader 46 has a high thermal conductivity. A layer of thermal interface material 48 may be applied to die 37. Thermal interface material 48 may comprise solder paste, highly conductive adhesive or thermal grease. In this manner, heat may be conducted away from die 37 toward top substrate 10, to which heatspreader 46 is attached.

FIG. 2E provides a more detailed view of heatspreader 46 and top substrate 10. As in the first embodiment, top substrate 10 may be a laminated substrate having multiple layers, including dielectric layers and conductive layers, such as conductive layer 27. In the illustrated embodiment, heat may be conducted away from die 37 by the heat conduction paths illustrated by arrows 29. For instance, heat may be conducted from die 37 to heatspreader 46 through thermal interface material 48. As addressed above, heatspreader 46 provides for good thermal conduction. Heat is conducted away from heatspreader 46 through conductive layer 44 to thermal vias 22 and thence to conductive layer 27.

Returning for a moment to FIG. 2D, another advantageous feature of the illustrated embodiment is shown. As illustrated, die 37 has a width, indicated as $W_1$. As such, it is sufficient for making thermal contact to die 37 that heatspreader 46 has a width roughly equivalent to $W_1$. Note, however, that in the illustrated embodiment, interposer 30 has a width $W_2$ which is larger than $W_1$. $W_2$ might be from about 1.2 to about 1.5 the width of $W_2$. In this way, heatspreader 46 provides an additional role of providing mechanical stiffness to the resulting package in addition to conducting heat away from die 37. It is believed that this mechanical stiffness prevents or at least reduces the severity of warpage resulting from, e.g., thermal expansion mismatch between the components of the resulting package.

Figure 3A:
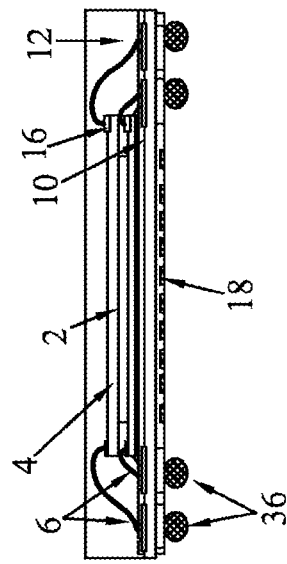
FIGS. 3A through 3D are cross sectional views of steps in the manufacture of a third embodiment device.

A third embodiment package will be discussed with reference to FIGS. 3A through 3A. Where appropriate, like or analogous elements are referenced with a common reference numeral in FIGS. 1A through 1E and 3A through 3D. Beginning with FIG. 3A, top package 1, to be employed in the PoP package is illustrated. Top package 1 in FIG. 3A may be formed using the same processes as top package 1 in the first embodiment. Top package 1 in FIG. 3A may include the same elements as package 1 in the first embodiment.

Figure 3B:
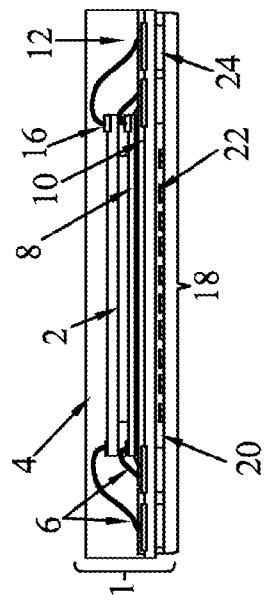

Continuing with FIG. 3B, connector elements 36 are attached to bottom contacts 24 of top substrate 10. As in the first embodiment, connector elements 36 allow for electrical and/or thermal connection between top package 1 and bottom package 34 (illustrated in FIG. 3C).

Figure 3C:
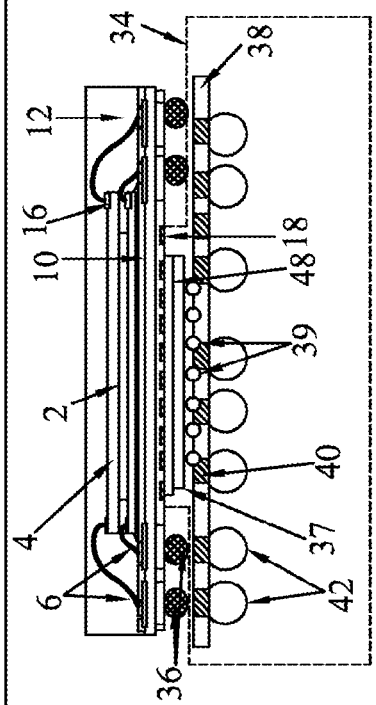

Bottom package 34 is attached to top package 1, as illustrated in FIG. 3C. As in the first embodiment, bottom package 34 includes die 37 which may be attached to an underlying mother board or other circuitry (not shown). Electrical connection is provided by through vias 40 aligned with connector elements 39 on one side of bottom substrate 38 and connector elements 42 on the other side of bottom substrate 38. Electrical connection between top substrate 10 and an underlying mother board or other circuitry is provided by connector elements 36, through vias 40, and connector elements 42.

As in the first embodiment, an advantageous feature of the illustrated package of FIG. 3c is a thermal conduction path provided between die 37 (in bottom package 34) and a thermally conductive layer 27, such as a ground plane (illustrated in FIG. 3d) in top substrate 10. This thermal conduction path is provided as follows. Die 37, which is flip chip connected to bottom substrate 38 has its so-called back side attached to thermal interface material 48. Thermal interface material 48 has a high thermal conductivity. Thermal interface material 48 may comprise of solder paste, highly conductive adhesive or thermal grease. Thermal interface material 48 may have a thickness of about 50 microns to about 100 microns. In this manner, heat may be conducted away from die 37 toward top substrate 10, to which thermal interface material 48 is attached.

Figure 3D:
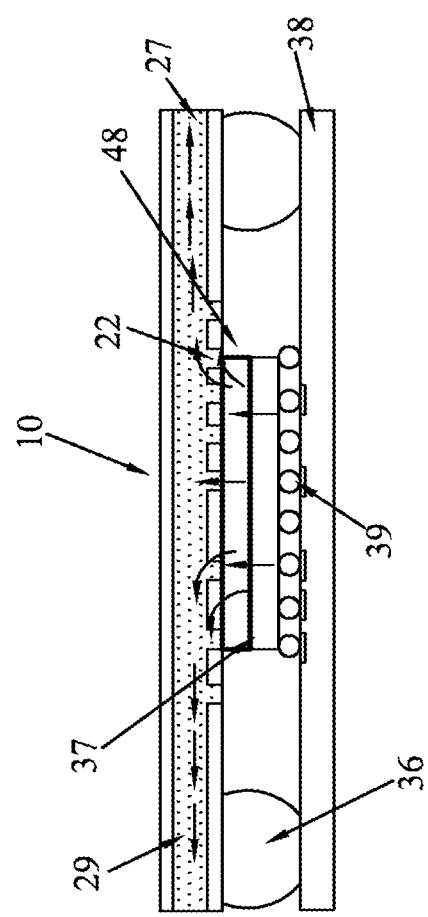

FIG. 3D provides a more detailed view of thermal interface material 48 and top substrate 10. As in the first embodiment, top substrate 10 may be a laminated substrate having multiple layers, including dielectric layers and conductive layers, such as conductive layer 27. In the illustrated embodiment, heat may be conducted away from die 37 by the heat conduction paths illustrated by arrows 29. For instance, heat may be conducted from die 37 to thermal interface material 48. As addressed above, thermal interface material 48 provides for good thermal conduction. Heat is conducted away from thermal interface material 48 through thermal vias 22 and thence to conductive layer 27.

Although the present embodiments and their advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method of forming a package comprising:
receiving a first package, the first package including a first die on a first substrate, the first substrate having a plurality of thermal vias, the thermal vias being thermally coupled to a heat conductive path in the first substrate;
receiving a second package, the second package including a second die on a second substrate; and
thermally coupling the second die and the plurality of thermal vias using a thermal conductor, wherein the plurality of thermal vias pass no signals between the second die and the first die.

2. The method of claim 1, wherein the thermal conductor comprises an interposer having through vias extending therethrough.

3. The method of claim 2, wherein the thermally coupling is performed at least in part using a thermal interface material interposed between the second die and the interposer.

4. The method of claim 2, wherein the thermally coupling comprises attaching the interposer to the plurality of thermal vias using solder bumps.

5. The method of claim 2, wherein the through vias of the interposer have an aspect ratio of from about 2 to about 6.

6. The method of claim 1, wherein the thermally coupling is performed at least in part using a thermal interface material interposed between the second die and the plurality of thermal vias.

7. The method of claim 1, wherein the thermal conductor comprises a heat spreader, the heat spreader being absent through vias.

8. A method of forming a package comprising:
receiving a first substrate, the first substrate including a thermally conductive layer having a plurality of thermal vias extending from the thermally conductive layer to an exterior surface of the first substrate, the plurality of thermal vias passing no electrical signals to semiconductor devices in the first substrate;
receiving a die comprising a plurality of connector elements; and
thermally coupling the die to the plurality of thermal vias after the thermal vias are formed, wherein the thermally coupling is performed at least in part using a thermal interface material interposed between the die and the plurality of thermal vias, wherein the exterior surface of the first substrate faces the die, and wherein the plurality of connector elements are disposed on an opposing side of the die as the thermal interface material.

9. The method of claim 8, wherein the thermally coupling comprises:
receiving an interposer having through vias extending therethrough; and
thermally coupling the interposer between the die and the first substrate.

10. The method of claim 9, wherein the thermally coupling the interposer is performed at least in part using a thermal interface material interposed between the die and the interposer.

11. The method of claim 9, wherein the thermally coupling the interposer comprises attaching through vias of the interposer to the plurality of thermal vias using solder bumps.

12. The method of claim 8, wherein the thermal coupling comprises:
  receiving a heat spreader; and
  thermally coupling the heat spreader between the die and the first substrate.

13. A method of forming a package comprising:
  receiving a first package, the first package including at first die on a first substrate, the first substrate having a thermally and electrically conductive layer therein, the first package having thermal vias extending from the thermally and electrically conductive layer towards an external surface, the thermal vias passing no electrical signals to the first die on the first substrate;
  receiving a second package, the second package including a second die on a second substrate; and
  thermally coupling the second die and the first substrate by way of a solid thermal conductor.

14. The method of claim 13, further comprising:
  forming through vias in the solid thermal conductor; and
  aligning the thermal vias and the through vias and thermally coupling the thermal vias and the through vias with connector elements.

15. The method of claim 14, wherein the through vias of the solid thermal conductor have a pitch of from about 0.1 mm to about 0.3 mm.

16. The method of claim 13, further comprising electrically coupling the first die to the first substrate and electrically coupling the first substrate to the second substrate.

17. The method of claim 13, wherein thermally coupling the second die and the first substrate comprises inserting an interposer between the second die and the first substrate.

18. The method of claim 13, wherein thermally coupling the second die and the first substrate comprises inserting a heat sink between the second die and the first substrate.

19. The method of claim 13, wherein thermally coupling the second die and the first substrate comprises inserting a thermally conductive material in a gap between the second die and the first substrate.

20. The method of claim 13, wherein the thermally and electrically conductive material is a ground plane or a power plane in the first substrate.

\* \* \* \* \*